United States Patent [19]

Brucculeri et al.

[11] Patent Number: 5,036,221
[45] Date of Patent: Jul. 30, 1991

[54] CIRCUIT FOR ELIMINATING METASTABLE EVENTS ASSOCIATED WITH A DATA SIGNAL ASYNCHRONOUS TO A CLOCK SIGNAL

[75] Inventors: Louis S. Brucculeri, Dallas; James N. Giddings, Mesquite, both of Tex.

[73] Assignee: Texas Instruments Incorporated, Dallas, Tex.

[21] Appl. No.: 331,477

[22] Filed: Mar. 31, 1989

[51] Int. Cl.$^5$ .................. H03K 5/13; H03K 19/00
[52] U.S. Cl. .................. 307/443; 307/480; 307/269; 328/109; 328/63
[58] Field of Search .......... 307/480, 443, 269, 600, 307/605, 234, 272.1, 272.3; 328/63, 72, 109, 110, 111

[56] References Cited

U.S. PATENT DOCUMENTS

| | | | |
|---|---|---|---|
| 3,979,732 | 9/1976 | Hepworth et al. | 328/109 |
| 4,518,865 | 5/1985 | Iwasaki | 307/592 |
| 4,694,196 | 9/1987 | Hasley et al. | 307/269 |
| 4,789,959 | 12/1988 | Hung et al. | 328/72 |
| 4,799,023 | 1/1989 | Firooz et al. | 307/234 |
| 4,851,710 | 7/1989 | Grivna | 307/269 |

Primary Examiner—Timothy P. Callahan
Attorney, Agent, or Firm—Ronald O. Neerings; Thomas W. Demond; Melvin Sharp

[57] ABSTRACT

A circuit for reducing the metastable events produced by a data signal asynchronous to a system clock signal is provided. The circuit includes an edge detector (32) for detecting a transistion of the data signal. The edge detector (32) controls a clock disable/reenable circuit (46) which will disable a system clock directed to a clocked device (36). The period of disablement is the minimum setup time for the clocked device (36). After the minimum setup time has passed, the disable/reenable circuit (42) will reenable the system clock to the clocked device (36). The system clock may be modified by a duration limit circuit (68). Data directed to the clocked device (36) may be delayed via a delay circuit (70).

16 Claims, 2 Drawing Sheets

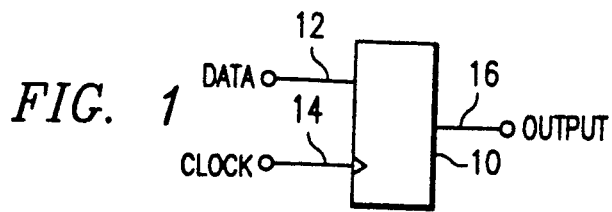
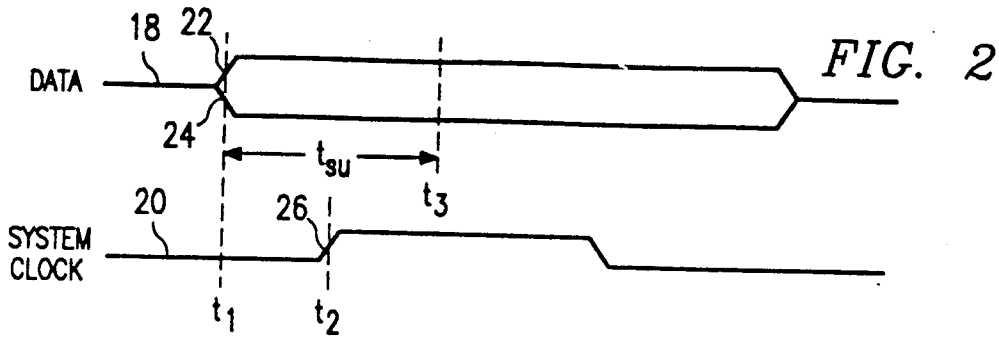
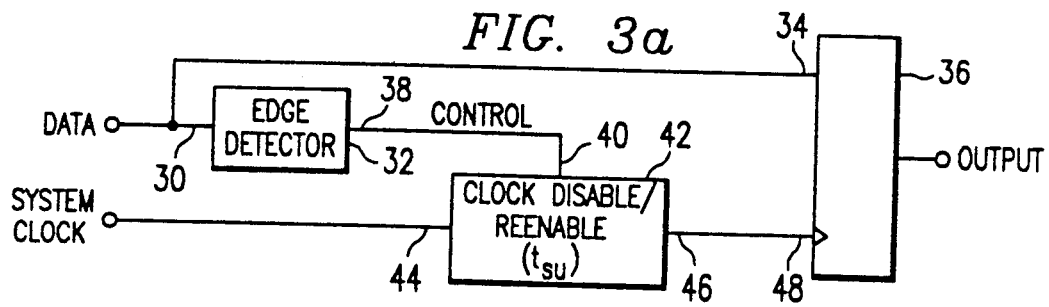
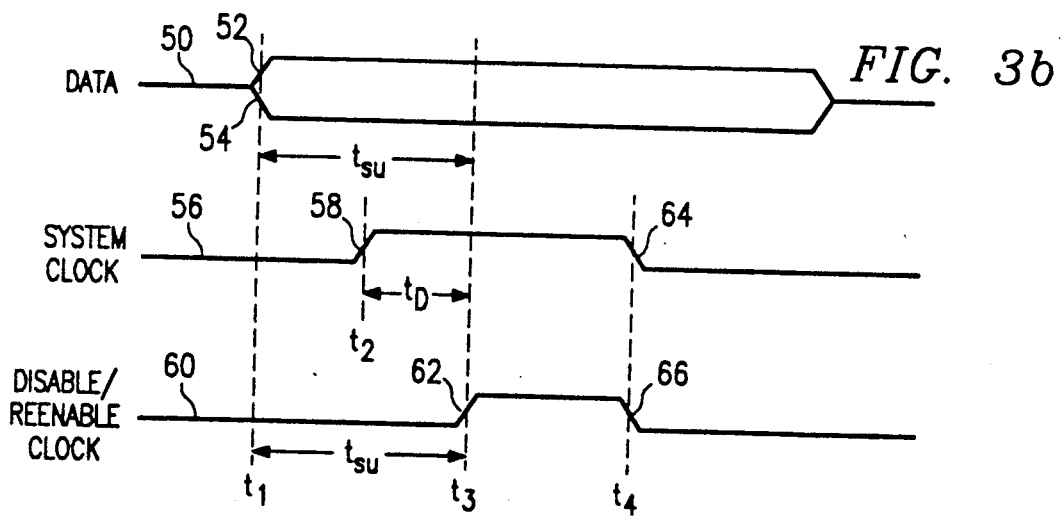
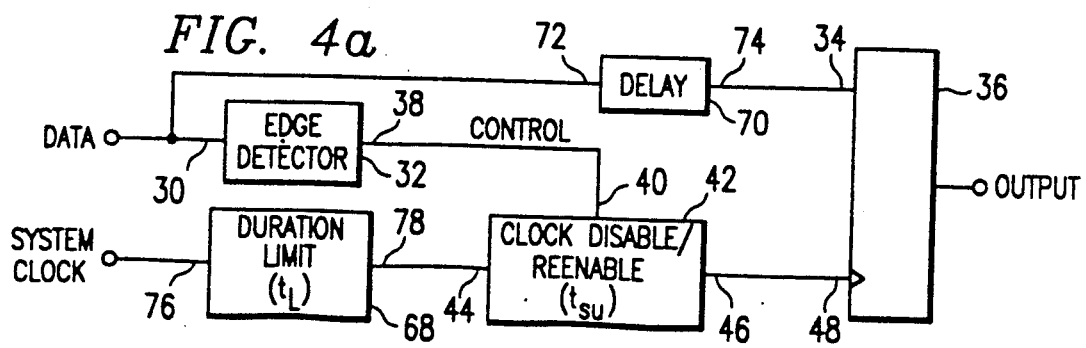

CIRCUIT FOR ELIMINATING METASTABLE EVENTS ASSOCIATED WITH A DATA SIGNAL ASYNCHRONOUS TO A CLOCK SIGNAL

TECHNICAL FIELD OF THE INVENTION

This invention relates to asynchronous data in synchronous networks, and more particularly to a circuit for eliminating metastable events arising from a clock signal asynchronous to a data signal.

BACKGROUND OF THE INVENTION

In digital logic circuitry, all clocked elements have a minimum specified setup time which defines the required time period which must pass between receipt of data and receipt of a clock signal. The specified setup time varies for different digital devices. Where the data signal is asynchronous to the clock signal, the setup time will usually be violated. If the setup time is violated, then the recipient chip may produce a metastable (i.e., invalid) result. This metastable result can further propagate through the network containing the recipient chip, thereby creating invalid data therethrough.

Under one current solution, the asynchronous data signal is routed through a series of two flip-flops in order to reduce the probability of violation of the setup time. However, this configuration requires an additional two clock periods to move the data through the flip-flops and to the recipient clocked device. Further, there still exists some probability that the setup time will be violated thereby giving rise to a metastable result.

Therefore, a need has arisen for a circuit to eliminate metastable events arising from a data signal asynchronous to a clock signal.

SUMMARY OF THE INVENTION

In accordance with the present invention, a circuit for eliminating metastable results is provided which substantially eliminates or reduces disadvantages and problems associated with prior asynchronous clock and data signals.

A circuit for eliminating the metastable events produced by a data signal asynchronous to a clock signal is provided which includes a disabling circuit which disables the system clock signal for a predetermined time period following detection of a transition of the data signal. The system clock is reenabled following completion of the predetermined time period. An edge detecting circuit is also provided to detect the transition of the data signal in order to trigger the disabling circuit. A duration circuit may be used to limit the high period of the system clock. Another aspect of the present invention includes a delay circuit to inhibit the data signal for a minimal delay time prior to transfer of the signal to the clocked device.

The present invention provides the technical advantage of eliminating metastable outputs associated with clock signals asynchronous to data signals. Another technical advantage of the present invention is minimization of the propagation delay between the time the system clock is reenabled and the occurrence of an output by the clocked device.

BRIEF DESCRIPTION OF THE DRAWINGS

For a more complete understanding of the present invention, reference is now made to the following drawings taken in conjunction with the following descriptions, in which:

FIG. 1 illustrates a circuit diagram of clocked device having a data and clock input, and an output dependent therefrom;

FIG. 2 illustrates a timing diagram of a data signal asynchronous to a system clock;

FIG. 3a illustrates a block diagram of the present invention;

FIG. 3b illustrates a timing diagram produced by the block diagram of FIG. 3a;

FIG. 4a illustrates a block diagram of the preferred embodiment of the present invention;

FIG. 4b illustrates a timing diagram produced by the block diagram of FIG. 4a.

DETAILED DESCRIPTION OF THE INVENTION

Figure 4B:
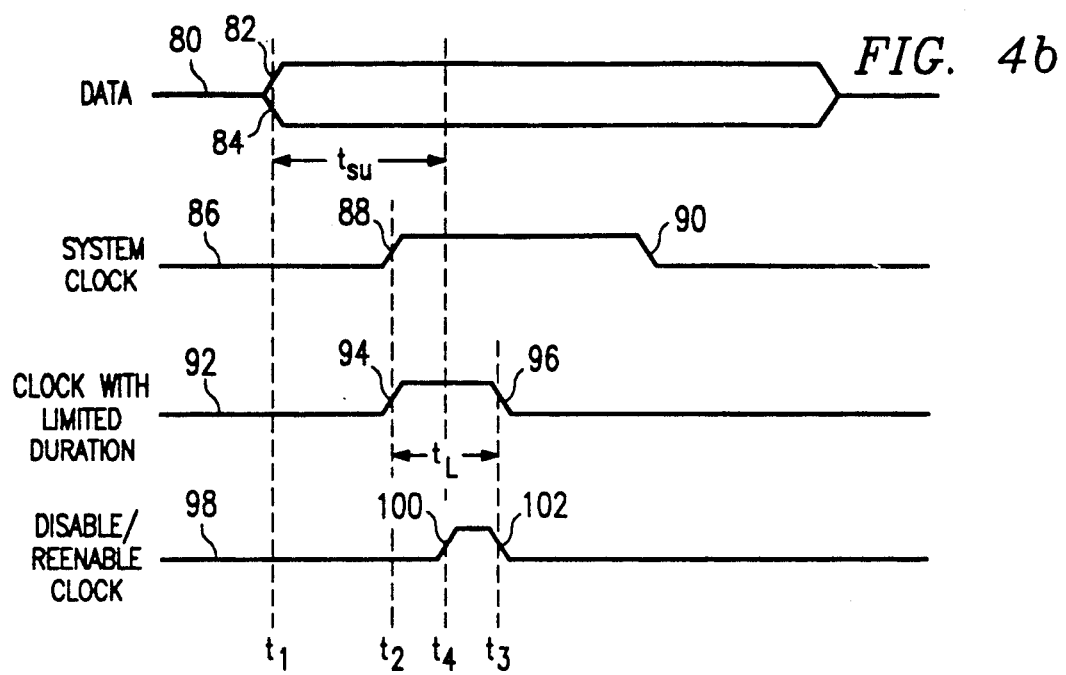

The preferred embodiment of the present invention is best understood by referring to FIGS. 1-5 of the drawings, like numerals being used for like and corresponding parts of the various drawings.

FIG. 1 illustrates a typical clocked device 10 as used with the present invention. Device 10 has a data line 12 and a clock line 14 connected thereto. An output line 16 is further provided with device 10. In operation of device 10, data is input on data line 12 in accordance with a subsequent clock signal provided along clock line 14. For all clocked devices, there exists a minimum setup time associated with the device. In order for a valid output to occur after data appears at data line 12, a time greater than or equal to the minimum setup time must pass between receiving a valid data signal on data line 12 and receiving the clock signal on clock line 14. If the setup time is violated, then a metastable (i.e., invalid) output may result.

FIG. 2 illustrates a timing diagram of the relationship between a data signal 18 which is asynchronous (i.e., has no phase relationship) to a system clock signal 20. Data signal 18 has a high transition 22 or a low transition 24 at time $t_1$. System clock signal 20 is asynchronous to data signal 18 and therefore has an active edge 26 at a time $t_2$ which has no predictable relationship to time $t_1$. It is to be understood that active edge may be either a high or low transition. A time $t_3$ is defined for data signal 18 in relation to time $t_1$. The difference in time between $t_3$ and $t_1$ represents the necessary setup time ($t_{su}$) for a clocked device 10. This setup time is a device specification which varies among different clocked devices.

In FIG. 2, active edge 26 of system clock signal 20 is shown to occur during the setup time $t_{su}$ associated with data signal 18. When this occurs, the output signal along output line 16 may be metastable or invalid. In other words, where the system clock signal 20 violates the setup time associated with data signal 18, a metastable event occurs creating an erroneous signal from clocked device 10 which may further propagate to any circuitry connected thereto.

FIG. 3a illustrates a block diagram of the present invention. The data signal is received on the input 30 of an edge detector 32 and the input 34 of clocked device 36. It is to be noted that clocked device 36 may be any clocked circuit, including one formed among other devices on an integrated circuit. An output 38 of edge detector 32 is a control signal connected to the input 40 of a clock disable/reenable circuit 42. The system clock signal is received on the input 44 of clock disable/reenable circuit 42. The output 46 of disable/reenable circuit 42 is connected to the clock input 48 of clocked device 36.

A circuit of FIG. 3a acts to prevent a metastable event from occurring. It is again noted that a metastable result will occur when the system clock has a transition on its active edge during the setup time following a data transition. The present invention prevents the metastable event from occurring by disabling the system clock from the clocked device during the setup period which occurs following transition of the data signal. The system clock is then reenabled following the completion of the setup period.

FIG. 3b illustrates a timing diagram resulting from operation of a circuit constructed according to the block diagram of FIG. 3a. A data signal 50 has either a high transition 52 or low transition 54 occurring at time $t_1$. The clocked device 36 has a setup time $t_{su}$ associated therewith which must pass after the data transition time $t_1$. If clocked device 36 receives a clock signal within the setup time, then a metastable event may occur. The system clock 56 has an active edge 58 which occurs at an arbitrary time $t_2$. In the situation depicted in FIG. 3b, active edge 58 has occurred during the setup time $t_{su}$ associated with data signal 50, and therefore, a metastable event may occur without the addition of the present invention. However, the clock disable/reenable circuit 42 prevents the metastable event from occurring, by generating disable/reenable clock signal 60 which is directed to clock input 48 of clocked device 36. Thus, system clock 56 is modified by clock disable/reenable circuit 42 prior to reaching clocked device 36.

The operation of the block diagram of FIG. 3a in accordance with the signals shown in FIG. 3b is as follows. When a data signal transition 52 or 54 occurs, edge detector 32 detects this transition and controls the clock disable/reenable circuit 42 to disable system clock 56 from clocked device 36. This disabling feature is effected by disabling disable/reenable clock signal 60 which is coupled to clocked device 36. In FIG. 3b, it is shown that detection of transition 52 or 54 occurs at a time $t_1$. Thereafter, disable/reenable circuit 42 will disable the clock signal sent to clocked device 36 until the setup time $t_{su}$ has elapsed at a time $t_3$. Once this setup time has passed, disable/reenable circuit 42 will reenable clock signal 60 to clocked device 36 at time $t_3$. Once clock signal 60 is reenabled, it will track system clock 56. Therefore, if system clock 56 is high at time $t_3$, then the reenabled clock signal 60 will also go high, creating an active edge 62 at time $t_3$. Further, once system clock 56 incurs a low transition 64, the reenabled clock signal 60 will track low transition 64, thereby creating a low transition 66 in the reenabled signal 60. Thus, from FIGS. 3a and 3b, it may be appreciated that clock input 48 of clocked device 36 will receive a disabled/reenabled signal 60 which cannot incur a high transition during the setup time associated with data signal 50. As a result, any possibility of a metastable event is eliminated.

While the construction depicted in FIGS. 3a and 3b forms a circuit to eliminate metastable events, it has been found that this construction requires further modification in order to provide optimum functional operation. From FIG. 3b, it may be appreciated that the circuit of FIG. 3a may effectively shift the clock signal received by clocked device 36 from a time $t_2$ to a time $t_3$. Without the circuit of FIG. 3a, clocked device 36 would have received active edge 58 at time $t_2$. However, the addition of the FIG. 3a circuit results in clocked device 36 receiving an active edge 62 at time $t_3$. Therefore, while the metastable event has been avoided, there has been a shift of time (i.e., $t_3 - t_2$) of the clock signal sent to clocked device 36.

Quite often the design of a digital network will include considerations of a parameter known as clock-to-Q. Clock-to-Q time is a specified parameter for any clocked device which defines the time which must pass after the device is clocked before the output thereof will be valid. Thus, in designing a digital circuit, the designer must be able to ascertain when the clock signal occurs in order to allow for the clock-to-Q time to pass thereafter. For example, in FIG. 3b, the designer anticipating the clock-to-Q time will measure that time from $t_2$, the active edge 58 of the system clock signal 56. However, the circuit of FIG. 3a will effectively shift the active edge time to $t_3$. Accordingly, the clock-to-Q time will begin at $t_3$ rather than $t_2$. Thus, the completion of the clock-to-Q time will be delayed by $t_D$, that is, the additional time between $t_3$ and $t_2$. It is therefore another aspect of the present invention to provide a duration circuit which will minimize the additional time $t_D$ between $t_2$ and $t_3$ which adds to the clock-to-Q of the clocked device.

FIG. 4a illustrates a block diagram similar to FIG. 3a but having a duration circuit 68 and a delay circuit 70 added thereto. The data signal is connected to the input 72 of delay circuit 70. The output 74 of delay circuit 70 is connected to input 34 of clocked device 36. The system clock is connected to the input 76 of duration limit circuit 68. An output 78 of duration limit circuit 68 is connected to input 44 of clock disable/reenable circuit 42.

FIG. 4b illustrates a timing diagram depicting additional benefits created by duration limit circuit 68. A data signal 80 may have either a high transition 82 or low transition 84 occurring at time $t_1$. Data signal 80 has a setup time $t_{su}$ which commences at time $t_1$ and will be specified for the clocked device receiving data signal 80. A system clock signal 86 will have an active edge 88 at time $t_2$ which is asynchronous to data signal 80 and correspondingly, to time $t_1$. System clock signal 86 will further have a low transition 90. Limited duration signal 92 is the signal which will be produced at output 78 of duration limit circuit 68. Limited duration signal 92 will have an active edge 94 at time $t_2$ and a low transition 96 at time $t_3$. The difference between times $t_3$ and $t_2$ represent the limited time $t_L$ that duration limit circuit 68 permits signal 92 to remain active. Disable/reenable signal 98 will be generated at output 46 of clock disable/reenable circuit 42.

The signals illustrated in FIG. 4b are generated in accordance with the same principles discussed with reference to FIG. 3b. However, clock disable/reenable circuit 42 receives system clock signal 86 after modification by duration limit circuit 68. Further, data sent to clocked device 36 is delayed by delay circuit 70. Although active edge 88 of system clock signal 86 occurs within setup time $t_{su}$, the clock signal to clocked device 36 is disabled during that time and thus, no clock signal will appear at clock input 48 of clocked device 36 at time $t_2$. As previously illustrated in reference to FIGS. 3a–3b, the disable/reenable clock signal 60 tracked the system clock signal 56 applied at input 44 of clock disable/reenable circuit 42. However, in reference to FIGS.

4a and 4b, the addition of duration limit circuit 68 will cause disable/reenable clock signal 98 to track limited duration signal 92 rather than system clock signal 86. Thus, at time $t_4$ when disable/reenable clock signal 98 is reenabled, there occurs an active edge 100 as the reenabled clock signal 98 tracks limited duration signal 92. Further, a low transition 102 of disable/reenable clock signal 98 will track low transition 96 of limited duration clock signal 92.

From the foregoing, it may be appreciated that if a high and low transition are to occur along disable/reenable clock signal 98, they must occur within the limited time $t_L$, and prior to $t_3$. As $t_L$ is minimized, time $t_3$ approaches time $t_2$ where the original system clock signal 86 has an active edge 88. The difference of time between $t_3$ and $t_2$ was defined earlier in reference to FIG. 3b as the additional delay time $t_D$ which may arise from the present invention. Thus, delay time $t_D$ and limited time $t_L$ are both defined as the difference in time between $t_3$ and $t_2$. Therefore, minimization of $t_L$ effectively reduces added delay time $t_D$ discussed above. As a result, there is a minimum amount of time added to the clock-to-Q time of the clocked device.

The edge detecting and clock disabling features discussed above require a minimal amount of propagation delay to occur. It is thus desirable to prevent data sent to clocked device 36 from reaching the device before the clock detection and disable features have had an opportunity to occur. Thus, delay circuit 70 has been added in order to delay data from reaching clocked device 36 for a time period just greater than the propagation time required for the detection and disabling features associated with the remainder of the components in FIG. 4a. It is to be noted that in numerous applications of the present invention, data will inherently be delayed prior to reaching clocked device 36. Delay circuit 70 may be wholly or partially substituted with this inherent delay associated with the circuit. As a result, any loss of efficiency due to circuit delay 70 is minimized. Further, if the delay created by delay circuit 70 is less than the inherent delay of the circuit, then the former is subsumed by the latter and no net delay is caused by the present invention.

Figure 5:
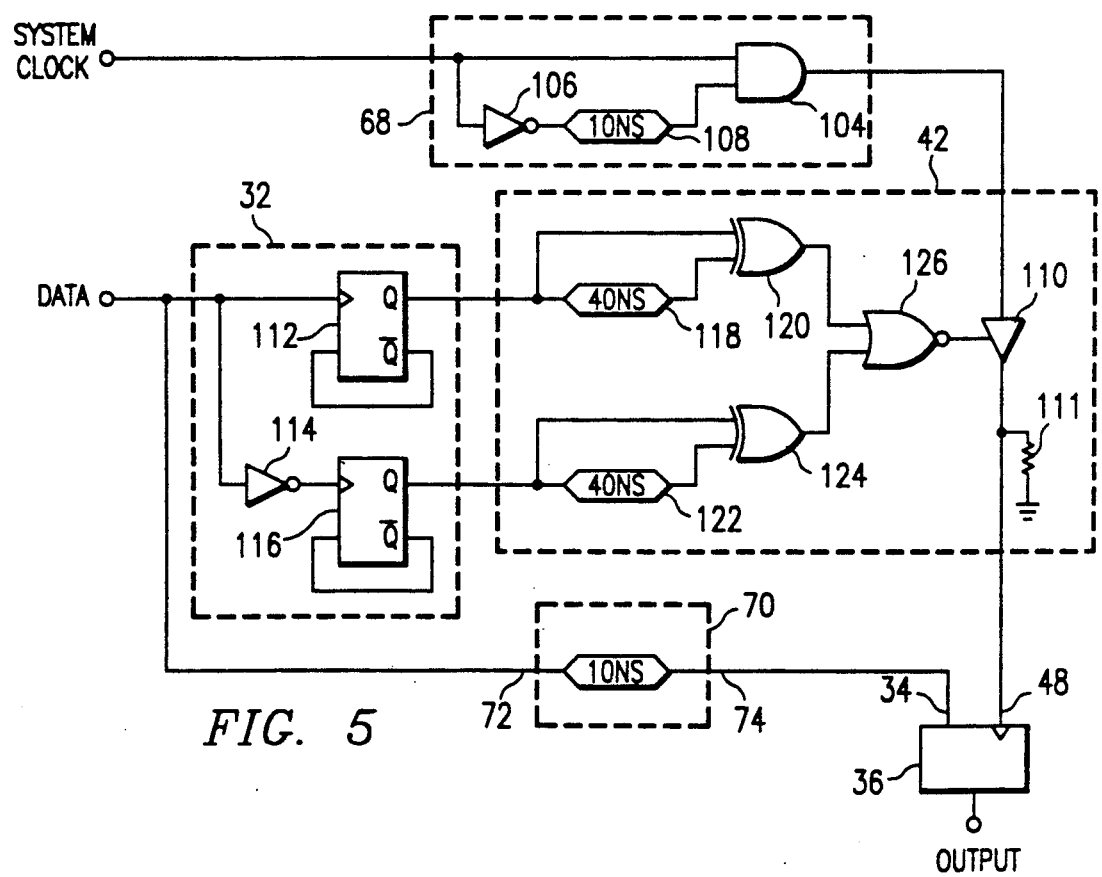
FIG. 5 illustrates a circuit diagram of the preferred embodiment of the present invention.

FIG. 5 illustrates the preferred embodiment of the present invention. The reference numerals associated with the block diagram of FIG. 4a are correspondingly indicated within FIG. 5. The system clock signal is connected to a duration limit circuit 68. Duration limit circuit 68 of the preferred embodiment is a one shot circuit. The system signal is connected to the first input of an AND gate 104 and an inverter 106. The output of inverter 106 goes through a ten nanosecond delay circuit 108 and into the second input of AND gate 104. The output of AND gate 104 connects to the data input of an active high enabling buffer 110. The output of active high enabling buffer 110 is connected both to a resistor 111 which is further connected to ground, and to the clock input 48 of clocked device 36.

The data signal is connected to edge detector 32 and delay circuit 70. Within edge detector 32, the data signal is connected to the clock input of a toggle flip-flop 112 and the input of an inverter 114. The inverted output of toggle flip-flop 112 is fed back to the data input of toggle flip-flop 112. The output of inverter 114 is connected to the clock input of toggle flip-flop 116. The inverted output of toggle flip-flop 116 is fed back to the input of toggle flip-flop 116. Toggle flip-flops 112 and 116 are D flip-flops fashioned in a toggle configuration.

It is to be understood that numerous other embodiments known in the art may be used for the toggling function provided for herein. The outputs of both toggle flip-flop 112 and toggle flip-flop 116 are connected generally to clock disable/reenable circuit 42. More particularly, the output of toggle flip-flop 112 is connected to a forty nanosecond delay circuit 118 and a first input of exclusive OR gate 120. The delayed signal from forty nanosecond delay circuit 118 is connected to the second input of exclusive OR gate 120. In a similar fashion, the output of toggle flip-flop 116 is connected to a forty nanosecond delay circuit 122 and a first input of exclusive OR gate 124. The delayed signal resulting from forty nanosecond delay 122 is connected to a second input of exclusive OR gate 124. The outputs of exclusive OR gate 120 and exclusive OR gate 124 are connected to the first and second inputs of NOR gate 126, respectively. The output of NOR gate 126 is used as a control signal for active high enabling buffer 110.

The operation of the circuitry in FIG. 5 is as follows. When a data transition occurs, it is detected by either flip-flop 112 or flip-flop 116 depending on whether the transition is positive or negative. For example, when a positive transition occurs, the signal acts as a clock signal to the clock input of flip-flop 112. Because the inverted output is tied to the input of flip-flop 112, a clock signal will cause the output to toggle, that is to yield an output different to the output existing prior to the clock signal. This new signal will be transmitted to exclusive OR gate 120. However, due to the forty nanosecond delay 118, the inputs to exclusive OR gate 120 will be different for forty nanoseconds. An exclusive OR gate with different inputs yields a one in its output which will be placed at the first input of NOR gate 126. Any high signal into a NOR gate causes its output to go low. This low signal will be placed at the control input of active high enabling buffer 110, and will therefore cause buffer 110 to be in a high impedance state. As a result, the system clock cannot conduct therethrough and is effectively disabled. After forty nanoseconds, forty nanosecond delay 118 will cause both inputs of exclusive OR gate 120 to match. Thus, the output of exclusive OR gate 120 will be a zero, which is placed at the input of NOR gate 126. Similarly, since no signal transition has occurred through flip-flop 116, the inputs to exclusive OR gate 124 will be identical, yielding a zero output therefrom which will be placed at the second input of NOR gate 126. The dual low input to NOR gate 126 will cause a high output which will permit active buffer 110 to conduct. Once active buffer 110 conducts, the system clock signal is allowed to pass therethrough and thus, is reenabled to the clock input 48 of clocked device 36. Thus, it may be appreciated that forty nanoseconds must elapse after a data transition before the system clock is reenabled. This forty nanosecond delay corresponds to the minimum setup time associated with clocked device 36. It is to be further understood that the forty nanosecond delays 118 and 122 could be altered to any desirable time to match the setup time of clocked device being driven by the present invention.

The various delay circuits shown within FIG. 5 may be constructed with principles as known in the art. For example, an even number of inventors may be cascaded in order to delay a signal passing therethrough.

Duration circuit 68 is a one shot configuration yielding a high output for a ten nanosecond time period in accordance with ten nanosecond delay circuit 108.

However, delay circuit 108 may be adjusted to any desirable time thereby rendering the output of AND gate 104 high for the time associated with delay circuit 108. The operation of duration circuit 68 is as follows. Prior to a system clock high transition, a "0" is placed at the first input of AND gate 104 while a "1" due to inverter 106 is placed at the second input of AND gate 104. As a result, AND gate 104 will produce a "0" output indicating that no high transition of the system clock signal has been received. When the system clock signal goes high, a "1" will be immediately placed at the first input of AND gate 104. However, due to the ten nanosecond delay circuit 108, the preexisting "1" signal will remain at the second input of AND gate 104 for ten nanoseconds. As a result, duration circuit 68 will yield a high output for ten nanoseconds. Again, it is to be understood that the delay time associated with duration circuit 68 may be adjusted in accordance with the principles and objectives set forth above. Delay circuit 70 delays data prior to its receipt at data input 34 of clocked device 36 in order to allow the propagation associated with edge detector 32 and clock disable/reenable circuit 42 as discussed above.

Although the present invention has been described in detail, it should be understood that various changes, substitutions and alterations can be made herein without departing from the spirit and scope of the invention as defined by the appended claims.

What is claimed is:

1. A circuit for reducing the metastable events in a clocked circuit produced by a data signal asynchronous with respect to a system clock signal input to the clocked circuit, comprising:
    a data line coupled to the clocked circuit for inputting a data signal;
    an edge detecting circuit coupled to the data line for detecting a transition in the data signal;
    a system clock for generating a system clock signal; and
    a disabling circuit coupled to the system clock, the edge detecting circuit and the clocked circuit for disabling the system clock signal from the clocked circuit for a predetermined time period following detection of said transition of the data signal.

2. The circuit of claim 1 wherein the disabling circuit reenables the system clock signal to the clocked circuit after said predetermined time period.

3. The circuit of claim 1 wherein said detecting circuit includes:
    a first toggle flip flop, having an input coupled to the data line and an output coupled to the disabling circuit, for detecting a positive transition of the data signal; and
    a second toggle flip flop, having an input coupled to the data line and an output coupled to the disabling circuit, for detecting a negative transition of the data signal.

4. The circuit of claim 1 including a duration circuit coupled to the system clock and the disabling circuit for limiting the active period of the system clock to the clocked circuit.

5. The circuit of claim 4 wherein said duration circuit comprises a one shot circuit.

6. The circuit of claim 1 wherein the clocked circuit has a minimum setup time, and wherein said predetermined time period equals the minimum setup time of the clocked device.

7. The circuit of claim 6 including a delay circuit coupled to the data line and the clocked circuit for delaying the data signal for a predetermined delay time prior to transfer of the data signal to the clocked circuit.

8. The circuit of claim 7 wherein said predetermined delay time is greater than the propagation delay associated with said disabling circuit.

9. A circuit for reducing the metastable events in a clocked circuit produced by a data signal asynchronous with respect to a system clock signal input to the clocked circuit, comprising:
    a data line coupled to the clocked circuit for inputting a data signal;
    an edge detecting circuit coupled to the data line for detecting a transition in the data signal;
    a system clock for generating a system clock signal; and
    a disabling/reenabling circuit coupled to the system clock, the edge detecting circuit and the clocked circuit for disabling the system clock from the clocked circuit for a predetermined time period following detection of said transition of the data signal, and for reenabling the system clock to the clocked circuit following the predetermined time period.

10. The circuit of claim 9 wherein the clocked circuit has a minimum setup time, and wherein said predetermined time period equals the minimum setup time of the clocked device.

11. The circuit of claim 9 including a duration circuit coupled to the system clock and the disable/reenable circuit for limiting an active period of the system clock.

12. The circuit of claim 10 including a delay circuit coupled to the data line and the clocked circuit for delaying the data signal prior to its receipt by the clocked circuit.

13. A method of reducing the metastable events in a clocked circuit having a minimum setup time and produced by a data signal asynchronous with respect to a system clock signal input to the clocked circuit, comprising the steps of:
    detecting a transition of the data signal;
    disabling the system clock signal from the clocked circuit for a predetermined time period in response to detecting the transition; and
    reenabling the system clock signal to the clocked circuit following the completion of the predetermined period.

14. The method of claim 13 including the step of limiting an active period of the system clock.

15. The method of claim 13 wherein said step of disabling for a predetermined time includes disabling for a time equal to the minimum setup time of the clocked circuit.

16. The method of claim 15 including the steps of:
    delaying the data signal for a predetermined delay time, the delay time being greater than a propagation time for the detection and disabling steps; and
    transferring the data signal to the clocked circuit following the predetermined delay time.

* * * * *